(12) United States Patent
Ueda et al.

(10) Patent No.: US 7,608,542 B2
(45) Date of Patent: Oct. 27, 2009

(54) LARGE-SIZE GLASS SUBSTRATE FOR PHOTOMASK AND MAKING METHOD, COMPUTER-READABLE RECORDING MEDIUM, AND MOTHER GLASS EXPOSURE METHOD

(75) Inventors: Shuhei Ueda, Joetsu (JP); Yukio Shibano, Joetsu (JP); Atsushi Watabe, Joetsu (JP); Daisuke Kusabiraki, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 413 days.

(21) Appl. No.: 11/587,902

(22) PCT Filed: Jun. 12, 2006

(86) PCT No.: PCT/JP2006/311723

§ 371 (c)(1),
(2), (4) Date: Oct. 27, 2006

(87) PCT Pub. No.: WO2006/134855

PCT Pub. Date: Dec. 21, 2006

(65) Prior Publication Data

US 2008/0261119 A1    Oct. 23, 2008

(30) Foreign Application Priority Data

Jun. 17, 2005 (JP) ............... 2005-178145
Nov. 30, 2005 (JP) ............... 2005-346118
Jun. 8, 2006 (JP) ............... 2006-159194

(51) Int. Cl.
*H01L 21/302* (2006.01)
*H01L 21/461* (2006.01)

(52) U.S. Cl. .......... 438/689; 438/14; 438/680; 365/237; 257/E21.023; 257/E21.039

(58) Field of Classification Search ............ 438/14, 438/16, 680, 689; 365/237; 65/29.11, 29.12; 257/E21.023, E21.039
See application file for complete search history.

(56) References Cited

U.S. PATENT DOCUMENTS

| 7,071,041 B2 * | 7/2006 | Yamazaki et al. ........... 438/166 |
| 2002/0155361 A1 | 10/2002 | Takeuchi et al. |
| 2003/0143403 A1 | 7/2003 | Shibano et al. |
| 2006/0003884 A1 * | 1/2006 | Nishizawa et al. ............ 501/72 |

FOREIGN PATENT DOCUMENTS

| EP | 1 253 117 A1 | 10/2002 |
| EP | 1 333 313 A1 | 8/2003 |
| JP | 2002-318450 A | 10/2002 |
| JP | 2003-186199 A | 7/2003 |
| JP | 2003-292346 A | 10/2003 |
| JP | 2004-359544 A | 12/2004 |

* cited by examiner

*Primary Examiner*—Phuc T Dang
(74) *Attorney, Agent, or Firm*—Birch, Stewart, Kolasch & Birch, LLP

(57) ABSTRACT

A large-size glass substrate, from which a photomask substrate is formed, is prepared by processing a large-size glass substrate stock by (1) a flattening removal quantity based on height data of the substrate stock in the vertical attitude plus a deformation-corrective removal quantity. The deformation-corrective removal quantity is calculated from (2) a deflection of the substrate stock by its own weight in the horizontal attitude, (3) a deformation of the photomask substrate caused by chucking in an exposure apparatus, and (4) an accuracy distortion of a platen for supporting a mother glass.

16 Claims, 2 Drawing Sheets

LARGE-SIZE GLASS SUBSTRATE FOR PHOTOMASK AND MAKING METHOD, COMPUTER-READABLE RECORDING MEDIUM, AND MOTHER GLASS EXPOSURE METHOD

This application is a 371 of PCT/JP2006/311723 Jun. 12, 2006

TECHNICAL FIELD

This invention relates to large-size glass substrates suitable for forming array side and color filter side photomask substrates in TFT liquid crystal panels; a method for preparing the same; a computer-readable recording medium having recorded therein a program for executing the method; and a method for exposure of a mother glass for use as array side and color filter side substrates in TFT liquid crystal panels.

BACKGROUND ART

In general, TFT liquid crystal panels are constructed by filling liquid crystals between an array side substrate having TFT devices built therein and a color filter substrate. They are based on the active matrix addressing scheme where TFTs apply controlled voltages for controlled alignment of liquid crystals.

In the manufacture of the array side substrate, patterns are formed in plural layers on a mother glass such as non-alkaline glass by repeating light exposure through originals having circuit patterns drawn thereon, known as large-size photomasks. On the other hand, the color filter side substrate is manufactured by a lithographic process known as dye immersion process. In the manufacture of both array and color filter side substrates, large-size photomasks are necessary. For a high accuracy of light exposure, such large-size photomasks are typically made of synthetic quartz glass characterized by a low coefficient of linear expansion.

So far, liquid crystal panels have progressed to higher definitions from VGA to SVGA, XGA, SXGA, UXGA and QXGA. It is believed that degrees of definition ranging from 100 pixels per inch (ppi) class to 200 ppi class are necessary. This, combined with an expanding exposure range, imposes a strict exposure accuracy, especially overlay accuracy, on the TFT array side.

Some panels are manufactured using the technology known as low-temperature polysilicon. In this case, it has been studied to bake a driver circuit or the like on a peripheral portion of glass, aside from the panel pixels, which requires light exposure of higher definition.

For a higher accuracy of light exposure, there is a need for large-size photomask-forming substrates exhibiting a higher flatness in the actual use state, that is, when supported in an exposure apparatus.

While the methods for processing large-size photomask-forming substrates utilize for flatness correction a reaction force against the elastic deformation generated when the substrate itself is forced against the processing platen, there is a drawback that as the substrate size becomes larger, the reaction force considerably decreases, leading to a reduction of the ability to remove moderate irregularities on the substrate surface. As the size of substrates becomes larger, the prior art polishing method is difficult to finish to the desired flatness.

To solve these problems, the inventors proposed in JP-A 2003-292346 and JP-A 2004-359544 a method for improving the flatness of a large-size glass substrate having a diagonal length of at least 500 mm, achieving a parallelism of 50 µm or less and a flatness/diagonal length of $6.0 \times 10^{-6}$ or less.

However, to perform multiple pattern panelization through a single exposure for the purpose of increased productivity of panel manufacture, there arises a need for large-size photomask substrates having a diagonal length of 1,000 mm or greater. Glass substrates are required to satisfy both large size and high flatness. In the case of such large-size glass substrates, sometimes a substrate becomes deflected on the actual use attitude where it is held horizontally in an exposure apparatus, failing to acquire the desired flatness. Since the deflection of a substrate by its own weight is in inverse proportion to the cube of its thickness, the size enlargement has a propensity that as the size of a substrate is increased, its thickness is also increased. As a result, the weight of large-size glass substrates is also increased. It is thus desired to have a method of flattening such large-size glass substrates to a higher level of flatness.

DISCLOSURE OF INVENTION

Problems to be Solved by the Invention

The present invention has been done in view of the above circumstances. An object of the invention is to provide a large-size glass substrate suitable for forming a photomask substrate that exhibits a high flatness when held horizontally on actual use in an exposure apparatus; a method for preparing the same; and a computer-readable recording medium having recorded therein a program representing the method. Another object is to provide a method for exposure of a mother glass for use as array side and color filter side substrates in TFT liquid crystal panels.

Means for Solving the Problems

The inventors have earnestly studied in order to attain the above object. As a result, the inventors have found that a large-size glass substrate obtained by a method to be described below is improved in that when a photomask substrate formed therefrom is horizontally held in an exposure apparatus, the photomask substrate offers a high flatness enough to significantly reduce a variation of the proximity gap between the photomask substrate and a mother glass serving as an array side or color filter side substrate in a TFT liquid crystal panel.

More particularly, when the photomask substrate is horizontally held in an exposure apparatus, substrate chucking means include the substrate upside support in which suction acts on the upper surface of the substrate along edges (four or two side support), and the substrate downside support in which the substrate rests on wedge supports in contact with the substrate lower surface along edges (usually two side support). In either means, when the photomask substrate is horizontally held, the photomask substrate deflects and deforms by its own weight. This deformation becomes exaggerated as the photomask substrate becomes larger in size. Such deflection/deformation increases a variation of the proximity gap between the photomask substrate and a mother glass disposed beneath the photomask substrate for exposure, giving noticeable negative impact on the exposure accuracy.

In the prior art, for reducing the proximity gap variation, in the event where the substrate upside support by suction is utilized in supporting the photomask substrate in an exposure apparatus, a force is applied so as to displace the substrate upper surface edges upward and outward to reduce the deflection around the substrate center. In the event where the substrate downside support is utilized in supporting the photomask substrate in an exposure apparatus, a downward force is applied to the edges outside the substrate support position to similarly reduce the deflection around the substrate center. However, this method in which the means of supporting the substrate in the exposure apparatus is devised to make a correction on the exposure apparatus side for reducing the proximity gap variation has the drawback that it is difficult and cumbersome to control the force to be applied to the substrate. As the photomask substrate becomes larger in size, a larger force is necessary, rendering the control more difficult.

Another method of using a glass substrate (for forming a photomask substrate) which has been flattened in the vertical attitude does not perform well when the photomask substrate or glass substrate is increased in size to a diagonal length of at least 500 mm, specifically at least 800 mm, especially at least 1,800 mm.

For large-size glass substrates having a diagonal length of at least 500 mm, specifically at least 800 mm, especially at least 1,800 mm, from which array side or color filter side photomask substrates in TFT liquid crystal panels are formed, known methods for measuring the flatness and parallelism of front and back surfaces of such a substrate include an optical interference technique of counting the number of interference fringes and a laser scanning technique in which a laser displacement meter runs in proximity to the front and back surfaces of the substrate for scanning. The method of holding the substrate during the measurement is traditionally vertical holding whereas the substrate is most often held horizontally on actual use. The reason why the substrate is vertically held when the flatness and parallelism of front and back surfaces are measured is that it is difficult to measure an accuracy when the substrate deflects under its own weight in the horizontal attitude, many diverse ways are utilized for holding the substrate horizontally in the exposure apparatus, and it is difficult to measure flatness under the same conditions as in the actual use. Since the deflection of the substrate is in inverse proportion to the cube of the substrate thickness, the propensity of substrate size enlargement that thickness is also increased as size is increased suggests, from the aspect of deflection, a possibility that even when the flatness of a substrate as usually measured in the vertical attitude is less than several tens of microns, the substrate on actual exposure will deform several tens to hundreds of microns by its own weight. No such problems arise if the way of substrate holding in the measurement of an accuracy such as flatness and parallelism of front and back surfaces of a substrate is the same as the way of substrate holding during exposure, that is, the time when the substrate is on use. In the current situation, however, no method of accurately measuring the flatness and parallelism of front and back surfaces of a substrate using the same substrate holding way has been developed. Then, the measurement of the flatness and parallelism of front and back surfaces of a substrate has to resort to the measurement method on a substrate in the vertical attitude. However, the flatness obtained with this measurement method substantially differs from the flatness of such a large-size photomask substrate when held in an exposure apparatus.

Reference is made to the flatness of currently available glass substrates as large-size photomask substrates for TFT exposure, for example. When a substrate having a size of 450×550 mm and a thickness of 5 mm exhibits a flatness/diagonal length of up to $6\times10^{-6}$ (flatness ~4 μm) as measured in the vertical attitude, this substrate, provided it is held by horizontal four-side simple support, will undergo a deflection by its own weight which corresponds to a flatness/diagonal length of $4.7\times10^{-5}$ (flatness ~34 μm) as estimated by material strength calculation. Then during the actual use in the horizontal attitude, the flatness is around 34 μm. Also, when a substrate having a size of 1,220×1,400 mm and a thickness of 13 mm exhibits a flatness/diagonal length of up to $6\times10^{-6}$ (flatness ~11 μm) as measured in the vertical attitude, this substrate, provided it is held by horizontal four-side simple support, will undergo a deflection by its own weight which corresponds to a flatness/diagonal length of $1.3\times10^{-4}$ (flatness ~243 μm) as estimated by material strength calculation. Then during the actual use in the horizontal attitude, the flatness is around 243 μm. With respect to a correction of such deflections, countermeasure is taken mainly on the side of exposure apparatus in the prior art, but becomes difficult as a result of substrate size enlargement.

In the specification, the front surface of the substrate is the surface which faces the mother glass during exposure (i.e., the lower surface). The term "surface flatness" is of the front surface. The back surface is the upper surface that is remote from the mother glass during exposure.

Addressing the manufacture of large-size glass substrates, the inventors have found that when a finally necessary/sufficient processing quantity of material to be removed (for flattening and deformation-correction) and an area to be processed are determined by comprehensively taking into account quantities (1) to (5) or (1) to (4) among (1) a flattening quantity of material to be removed determined on the basis of height data of the flatness and parallelism of the front and back surfaces of the large-size glass substrate stock in the vertical attitude which are obtained by accurately measuring the flatness and parallelism of the front and back surfaces of the large-size glass substrate stock in the vertical attitude (i.e., in the state where a deflection by its own weight in the horizontal attitude does not occur), (2) a quantity of material to be removed given by previously taking into account a deflection of the substrate stock by its own weight, calculated from the thickness and size of the substrate stock and the support position when the photomask substrate (formed from the substrate stock) is horizontally supported, (3) a quantity of material to be removed given by previously taking into account a deformation of the photomask substrate caused by the photomask substrate support when the photomask substrate is supported in the exposure apparatus, (4) a quantity of material to be removed as calculated from an accuracy distortion of a platen for supporting the mother glass, and (5) a quantity of material to be removed determined by previously taking into account changes of flatness during subsequent both-side polishing or single-side polishing if performed; and when a processing tool or the substrate stock is moved in the direction of the substrate stock surface to process the respective surfaces of the substrate stock; there is obtained a large-size glass substrate having a diagonal length of at least 500 mm, especially at least 1,000 mm, and a flatness/diagonal length of up to $4.8\times10^{-5}$ in the horizontal attitude. Then, when a photomask substrate formed from the large-size glass substrate is supported in an exposure apparatus, a variation of the proximity gap between the photomask substrate and a mother glass serving as an array side or color filter side substrate in a TFT liquid crystal panel is reduced, eliminating or mitigating a need for correction on the side of the exposure apparatus. As a result, the proximity gap variation is readily eliminated.

Figure 1:
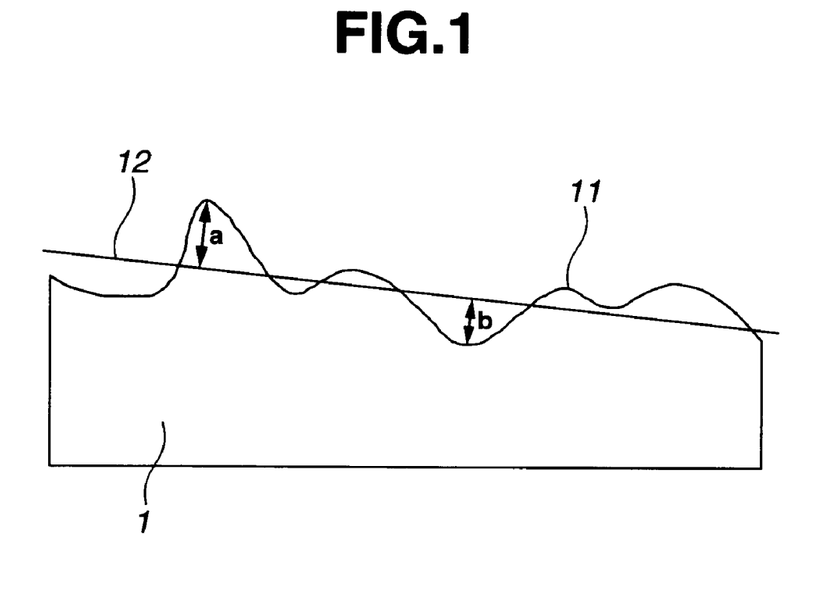
FIG. 1 is a schematic cross-sectional view of a substrate, illustrating a flatness.
Figure 2:
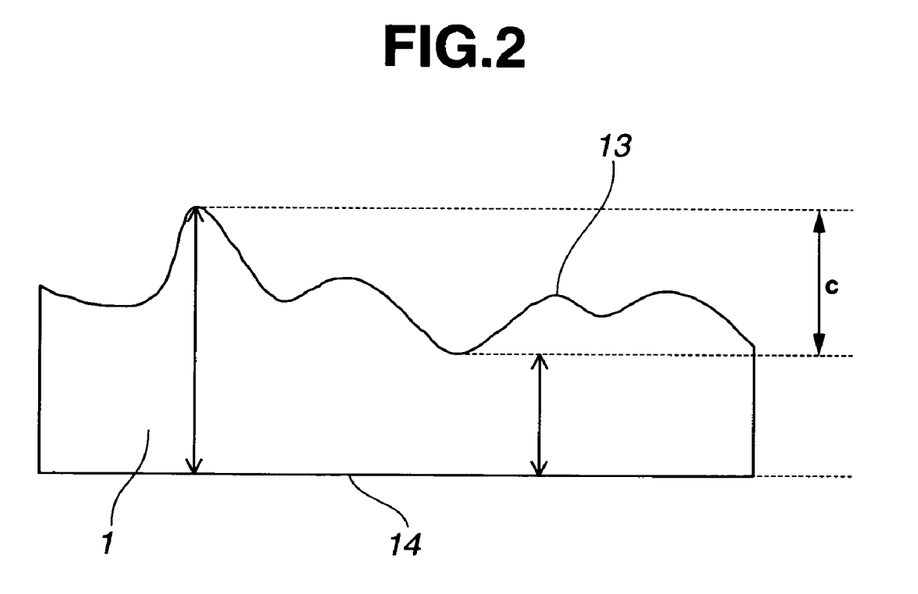
FIG. 2 is a schematic cross-sectional view of a substrate, illustrating a parallelism.

In the present invention, provided the least square plane calculated from a surface under test is used as a reference plane, the flatness of the substrate is the sum of a maximum (absolute value) "a" and a minimum (absolute value) "b" of the distance between the surface under test and the reference surface as shown in FIG. 1. The flatness is generally known as a total indicator reading (TIR). The parallelism of the substrate is the difference "c" between a maximum and a minimum of the distance between front and back surfaces in FIG. 2. The parallelism is generally known as a total thickness variation. (TTV). In FIG. 1, numeral 1 is the substrate, numeral 11 is the surface under test, and numeral 12 is the least square plane. In FIG. 2, numeral 1 is the substrate, numeral 13 is the front surface, and numeral 14 is the back surface.

Accordingly, the present invention provides a photomask-forming large-size glass substrate, a method for preparing the same, a method for the exposure of mother glass, and a computer-readable recording medium, as defined below.

Claim 1:
A method for preparing a large-size glass substrate, from which a photomask substrate is formed,
the photomask substrate being used in a mother glass exposure process including attaching a photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate,
said method comprising the step of processing a large-size glass substrate stock having front and back surfaces and a diagonal length of at least 500 mm and a thickness of at least 4 mm into the large-size glass substrate, by removing therefrom (1) a flattening removal quantity of material based on height data of the flatness and parallelism of the front and back surfaces of the large-size glass substrate stock in the vertical attitude, plus a deformation-corrective removal quantity of material,
the deformation-corrective removal quantity being calculated from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass,
wherein the resulting large-size glass substrate has such an arcuate shape in cross section that the surface to be opposed to the mother glass is concave when held vertically, and reduces the proximity gap variation between the mother glass and the photomask substrate formed from the large-size glass substrate which is held horizontally when the opposed side edges of the photomask substrate are supported in the exposure apparatus.

Claim 2:
The method of claim 1, wherein the method further comprises, after the processing (for flattening and deformation-correction) step, the post step of polishing the glass substrate on one or both of its surfaces,
the deformation-corrective removal quantity being calculated by further adding (5) a change of flatness by the post step of polishing.

Claim 3:
The method of claim 1 or 2 wherein the removing step uses a processing tool of sand blasting.

Claim 4:
The method of claim 3 wherein the removing step using a processing tool of sand blasting is performed at a constant pressure.

Claim 5:
The method of claim 3 or 4 wherein the sand blasting uses particles of cerium oxide, silicon oxide, aluminum oxide or silicon carbide.

Claim 6:
The method of any one of claims 1 to 5 wherein the surface of the substrate stock at an arbitrary position is processed while the substrate stock and/or the processing tool is moved.

Claim 7:
A large-size glass substrate, from which a photomask substrate is formed, wherein
the photomask substrate is used in a mother glass exposure process including attaching a photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate,
said large-size glass substrate is produced by processing a large-size glass substrate stock having front and back surfaces and a diagonal length of at least 500 mm and a thickness of at least 4 mm, by (1) a flattening removal quantity of material based on height data of the flatness and parallelism of the front and back surfaces of the large-size glass substrate stock in the vertical attitude, plus a deformation-corrective removal quantity of material,
the deformation-corrective removal quantity is calculated from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass,
the large-size glass substrate has such an arcuate shape in cross section that the surface to be opposed to the mother glass is concave when held vertically, and reduces the proximity gap variation between the mother glass and the photomask substrate formed from the large-size glass substrate which is held horizontally when the opposed side edges of the photomask substrate are supported in the exposure apparatus.

Claim 8:
The large-size glass substrate of claim 7 which has a surface flatness/diagonal length of up to $4.8 \times 10^{-5}$ in the horizontal attitude.

Claim 9:
The large-size glass substrate of claim 7 or 8 which has a diagonal length of up to 825 mm and a thickness from 3 mm to less than 6 mm.

Claim 10:
The large-size glass substrate of claim 7 or 8 which has a diagonal length of 800 to 1650 mm and a thickness of 6 to 11 mm.

Claim 11:
The large-size glass substrate of claim 7 or 8 which has a diagonal length of 1800 to 2150 mm and a thickness of 9 to 16 mm.

Claim 12:
The large-size glass substrate of claim 7 or 8 which has a diagonal length of 2151 to 3000 mm and a thickness of 9 to 20 mm.

Claim 13:
A mother glass exposure process comprising attaching a photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate, wherein said photomask substrate is formed from a large-size glass substrate which is prepared by processing a large-size glass substrate stock having front and back surfaces and a diagonal length of at least 500 mm and a thickness of at least 4 mm, by (1) a flattening removal quantity of material based on height data of the flatness and parallelism of the front and back surfaces of the large-size glass substrate stock in the vertical attitude, plus a deformation-corrective removal quantity of material, the deformation-corrective removal quantity is calculated from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass, the large-size glass substrate has such an arcuate shape in cross section that the surface to be opposed to the mother glass is concave, when held vertically, the photomask substrate is held horizontally when the opposed side edges of the photomask substrate are supported in the exposure apparatus, whereby the proximity gap variation between the mother glass and the photomask substrate is reduced.

Claim 14:
The mother glass exposure process of claim 13 wherein the large-size glass substrate has a surface flatness/diagonal length of up to $4.8 \times 10^{-5}$ in the horizontal attitude.

Claim 15:
A computer-readable recording medium for recording a method for preparing a large-size glass substrate from a large-size glass substrate stock having front and back surfaces and a diagonal length of at least 500 mm and a thickness of at least 4 mm, a photomask substrate being formed from said large-size glass substrate, the photomask substrate being used in a mother glass exposure process including attaching the photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate, said medium having recorded therein a program for operating the computer to execute the following steps:

a step of calculating (1) a flattening removal quantity of material based on height data of the flatness and parallelism of the front and back surfaces of a large-size glass substrate stock having a diagonal length of at least 500 mm and a thickness of at least 4 mm in the vertical attitude, a step of calculating a deformation-corrective removal quantity of material from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass, and a step of delivering a command to a processing machine to carry out processing for flattening and deformation-correction by removing a total quantity of material derived from the flattening removal quantity and the deformation-corrective removal quantity.

Claim 16:
The recording medium of claim 15 wherein the method further comprises, after the processing (for flattening and deformation-correction) step, the post step of polishing the glass substrate on one or both of its surfaces, the program further includes a step of calculating the total quantity of material by further adding (5) a change of flatness by the post step of polishing.

EFFECT OF THE INVENTION

When a photomask substrate formed from the large-size glass substrate of the invention is used in the exposure process, the exposure accuracy, especially registration accuracy and resolution are improved. This not only enables exposure of a high definition large-size panel, but also reduces the burden of exposure correction and improves the production yield of panels. An exposure apparatus of the so-called proximity type (i.e., proximity aligner) which is used only on the color filter side in the prior art can be used on the TFT array side to which a projection exposure apparatus (i.e., projection aligner) is assigned in the prior art. Another potential advantage on the color filter side is that an exposure apparatus of the proximity type is adaptable to the black matrix and photo-spacer as well as RGB.

When exposure is carried out using a photomask substrate formed from the large-size glass substrate of the invention, the proximity gap is made small and uniform so that control of the proximity gap is facilitated. As a result, the number of products by exposure can be increased and the large-size glass substrate allows for efficient exposure.

When projection exposure is carried out using a photomask substrate formed from the large-size glass substrate of the invention, the burden of correction of a shifting of an optical axis by substrate deflection is reduced. A need for correction of the proximity gap on the exposure apparatus side is eliminated.

BEST MODE FOR CARRYING OUT THE INVENTION

One embodiment of the invention is a method for preparing a large-size glass substrate, from which a photomask substrate is formed, specifically a large-size glass substrate having a diagonal length of at least 500 mm and a thickness of at least 4 mm and serving as an array side or color filter side substrate in a TFT liquid crystal panel.

Material to be Removed

As substrates become larger in size, it becomes necessary to process a substrate stock by previously taking into account not only (1) a flattening quantity of material to be removed from the substrate stock itself, but also (2) a deflection of the substrate stock by its own weight, calculated from the thickness and size of the substrate stock, and the support position when the photomask substrate (formed from the substrate stock) is horizontally supported, (3) a deformation of the photomask substrate caused by the photomask substrate support when the photomask substrate is attached to the exposure apparatus, (4) an accuracy distortion of a platen for supporting the mother glass subject to exposure, and (5) a change of flatness by subsequent polishing. Although measurement of the substrate shape is ideally carried out in the zero gravity state, measurement in the vertical attitude is fully acceptable because the deflection of the substrate by its own weight in the vertical attitude is negligibly little for the accuracy of the substrate to be manufactured herein.

The quantities of material to be removed from a large-size glass substrate stock that should be considered in the method for preparing a large-size glass substrate according to the invention are: (1) a flattening quantity of material to be removed determined on the basis of height data of the flatness and parallelism of the front and back surfaces of the substrate stock in the vertical attitude which are obtained by accurately measuring the flatness and parallelism of the front and back surfaces of the substrate stock in the vertical attitude (i.e., in the state where a deflection by its own weight in the horizontal attitude does not occur), (2) a quantity of material to be removed given by previously taking into account a deflection of the substrate stock by its own weight, calculated from the thickness and size of the substrate stock and the support position when the photomask substrate (formed from the substrate stock) is horizontally supported, (3) a quantity of material to be removed given by previously taking into account a deformation of the photomask substrate caused by the photomask substrate support when the photomask substrate is supported in the exposure apparatus, (4) a quantity of material to be removed as calculated by taking into account an accuracy distortion of a platen for supporting the mother glass, and (5) a quantity of material to be removed determined by previously taking into account changes of flatness during subsequent both-side polishing or single-side polishing if performed. In the method for preparing a large-size glass substrate according to the invention, a finally necessary/sufficient processing quantity of material to be removed from front and back surfaces of a substrate stock and an area to be processed are determined by comprehensively taking into account quantities (1) to (5) or (1) to (4) among the foregoing quantities (1) to (5). Processings by quantities (2), (3) and (4) are collectively referred to as deformation-corrective processing and the sum of quantities (2), (3) and (4) is referred to as a deformation-corrective removal quantity.

Flattening

First, a flattening quantity Q1 of material to be removed determined on the basis of height data of the flatness and parallelism of the front and back surfaces of a large-size glass substrate stock in the vertical attitude is described. A large-size glass substrate stock, typically plate stock, as the starting stock is measured for flatness and parallelism. Measurement of flatness and parallelism may be carried out using a flatness meter, for example, FTT-1500 (Kuroda Precision Industries Ltd.) while holding the substrate stock in the vertical attitude in order to eliminate any deflection of the substrate stock by its own weight.

The method of the invention starts with measuring the flatness of opposite surfaces of a large-size glass substrate stock to be flattened. When the parallelism of a large-size glass substrate stock should also be considered, the flatness and parallelism of opposite surfaces are measured. Specifically, height (in a direction perpendicular to substrate front and back surfaces) data indicative of the flatness and parallelism of front and back surfaces of a large-size glass substrate stock in the vertical attitude are obtained. Using as a reference plane the least square plane calculated from the surface to be flattened on the basis of the height data, a flattening removal quantity is calculated so that the height coincides with the lowest point within the surface to be flattened.

For reducing the overall processing time, in a preferred embodiment, the substrate stock (or plate stock) has been mirror finished by a double- or single-side lapping machine so as to provide as moderate a flatness and/or parallelism as possible.

A program delivering to a computer a command for a processing tool to carry out flattening processing by removing a quantity of material calculated by the above step and simultaneously deformation-corrective processing (to be described later) may be stored in a computer-readable recording medium. Then simulation may be performed using the recording medium.

Deflection by Own Weight

A deflection of the substrate stock by its own weight is calculated on material strength basis from the thickness and size of the substrate stock and the support position of the photomask substrate (formed from the substrate stock) when supported horizontally, using the surface calculated and presumed to result from the above flattening processing as a reference. The support position is the same as when the photomask substrate is supported in an exposure apparatus.

Substrate Deformation

The photomask substrate is deformed when it is set in place in the exposure apparatus by chucking. The quantity of deformation varies with the area and shape of the chucked portions, the surface accuracy of chucking plates, and whether the chucking support is at two sides or four sides. Any of these factors can be simulated by the finite element method. In a preferred procedure, a dummy glass substrate stock is actually supported in place in the exposure apparatus, a quantity of deformation that the dummy glass substrate stock undergoes is measured, and then a quantity of material removal from a glass substrate stock to be processed is determined so as to comply with the measured quantity.

Accuracy Distortion of Platen

A variation of the distance between a mother glass serving as an array side or color filter side substrate in a TFT liquid crystal panel and the surface of the photomask substrate, known as proximity gap, can be affected by the flatness of a platen in the exposure apparatus (governed by the processing accuracy of the platen itself, the assembly accuracy of the platen, deformation by temperature during exposure and the like), that is, the accuracy distortion of the platen. This must be taken into account before the deformation-corrective removal quantity is determined. Likewise in a preferred procedure, a dummy glass substrate stock is actually supported in place in the exposure apparatus, a dummy mother glass is rested on a platen, a variation in the proximity gap therebetween is measured, and then a quantity of material removal from a glass substrate stock to be processed is determined so as to comply with the measured quantity.

Actually, a difference obtained by subtracting a processing quantity (obtained from flattening removal quantity and own weight deflection) from the proximity gap variation corresponds to a processing quantity based on substrate deformation and platen accuracy distortion.

It is noted that the proximity gap is measured from the lower side using a laser displacement meter.

Polishing

Most often, the post step of polishing one or both surfaces of the glass substrate is carried out to improve surface roughness and eliminate microscopic defects, for example, so as to reach the finally desired surface quality. If the post step of finish polishing is unnecessary for the desired surface quality or a change of flatness by finish polishing of the post step is very little, the quantity of material to be removed determined by previously taking into account a change of flatness by polishing can be omitted.

Finish polishing may be carried out on the front surface or the front and back surfaces in a conventional manner by means of a double- or single-side polishing machine using soft polishing cloth with abrasives such as cerium oxide.

In the actual processing for removal, the feed rate (or residence time) of a processing tool or the substrate stock in a substrate surface direction is altered on the basis of the processing removal quantity (flattening and deformation-corrective processing quantities) determined by totaling quantities (1) to (4) or (1) to (5) calculated from the respective factors whereby a locally necessary and sufficient quantity is removed on the opposite surfaces of the substrate stock by the processing tool.

Sand Blasting

When processing for flattening and deformation-corrective processing is carried out on the basis of the above-calculated quantities, processing with a controlled residence time is possible. Provided that the processing tool is a sand blasting tool, the feed rate of the sand blasting nozzle is slowed to extend the residence time where more substrate material should be removed based on the measured data, or inversely, the feed rate of the sand blasting nozzle is increased to shorten the residence time where less substrate material should be removed.

It is also possible to carry out processing by controlling the distance between the substrate and the sand blasting nozzle while setting the feed rate and pneumatic pressure of the nozzle fixed. This utilizes the processing characteristics that the processing speed is fast when the distance between the sand blasting nozzle and the substrate stock surface is short and is slow when the distance is long.

Instead, while the feed rate of the sand blasting nozzle is set constant, the processing is achievable through pressure control, such as by increasing the air blasting pressure of the sand blasting nozzle at the point for which a larger quantity of material removed is assigned and reducing the air blasting pressure at the point for which a smaller quantity of material removed is assigned.

Figure 3:
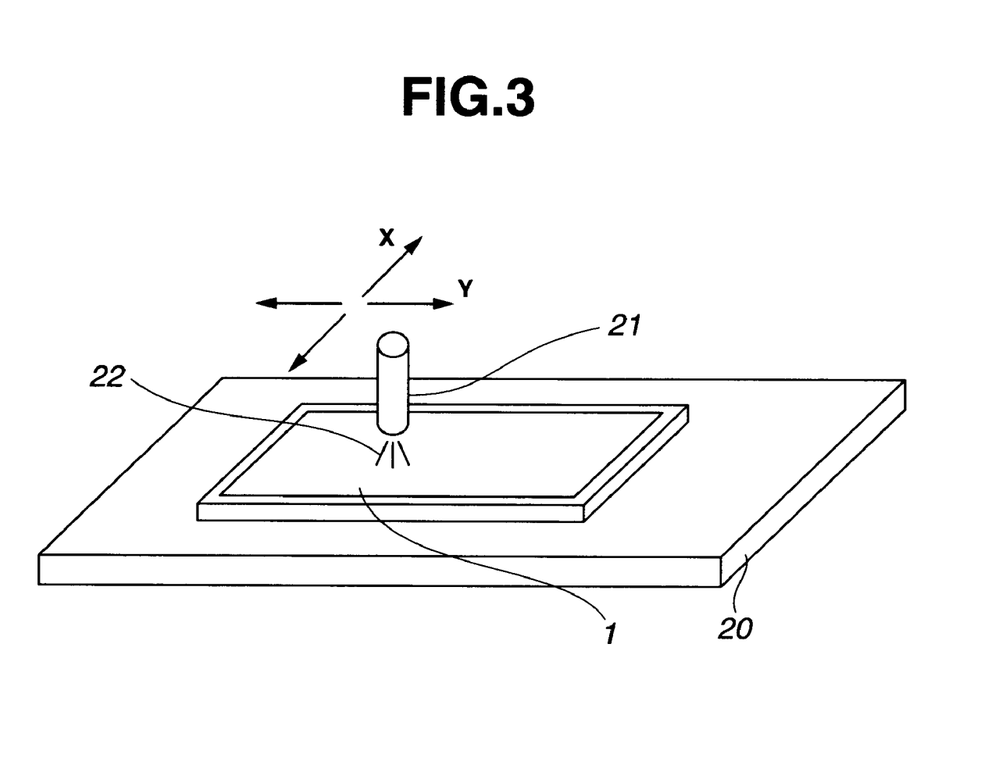
FIG. 3 is a perspective view of a processing apparatus.

In the event the processing tool is a sandblasting nozzle, processing is possible with the apparatus shown in FIG. 3. A sandblasting nozzle 21 for creating a blast 22 of abrasives is movable substantially parallel to a platform 20 and spaced from the surface of a substrate stock 1 on the platform 20 by a certain distance.

The processing tool is movable in X and Y directions while its movement is controlled by a computer. Equivalent processing is possible with an X-θ mechanism. Since the pneumatic pressure is related to the abrasives used and the tool-substrate distance, it is not determined unequivocally, but adjusted in terms of the removal rate and the depth of work damaged layer.

The abrasives used herein are not particularly limited although abrasives having a particle size of #600 to #3000 are preferred. Abrasives having a particle size of greater than #600 form a large distorted processing layer by processing, and then a more amount of material must be removed in the post step to remove the distorted processing layer, and more stock is necessary because the thickness must be increased. This is uneconomical. If abrasives have a particle size of less than #3000, the removal rate becomes slow, taking a longer time for sand blasting.

Fine particles used in the sand blasting are preferably cerium oxide, silicon oxide, aluminum oxide or silicon carbide.

Substrate

The large-size glass substrate obtained by the inventive method has a diagonal length of at least 500 mm, preferably at least 800 mm, more preferably at least 1,800 mm, and a thickness of at least 4 mm. The diagonal length is usually up to 2,500 mm although the upper limit need not be specified. For a diagonal length of up to 825 mm (500 to 825 mm), the thickness is in a range of 3 mm to less than 6 mm; for a diagonal length of 800 to 1,650 mm, the thickness is in a range of 6 to 11 mm; for a diagonal length of 1,800 to 2,150 mm, the thickness is in a range of 9 to 16 mm; for a diagonal length of 2,151 to 3,000 mm, the thickness is in a range of 9 to 20 mm. The shape of the large-size substrate may be square, rectangular, circular or the like. In the case of circular substrates, the diagonal length refers to the diameter.

The large-size glass substrate has such an arcuate shape in cross section that the surface to be opposed to the mother glass is concave in the vertical attitude. The large-size glass substrate exhibits a surface flatness/diagonal length of up to $4.8 \times 10^{-5}$, preferably up to $2.4 \times 10^{-5}$, more preferably up to $1.2 \times 10^{-5}$, at the horizontal attitude, that is, when it is held horizontally during exposure. The surface flatness/diagonal length is usually at least $2 \times 10^{-6}$ although the lower limit need not be specified. The back surface does not require a flatness as does the front surface. Though not critical for this reason, the back surface flatness/diagonal length is preferably up to $4.8 \times 10^{-5}$, more preferably up to $2.4 \times 10^{-5}$. The back surface flatness/diagonal length is usually at least $2 \times 10^{-6}$ although the lower limit need not be specified.

The large-size glass substrate preferably has a parallelism of up to 50 μm, more preferably up to 10 μm. With a parallelism of more than 50 μm, an extra burden may be imposed on such an operation as a correction to reduce the exposure gap when the substrate is installed in the exposure apparatus.

Exposure

A mother glass exposure process using the large-size glass substrate is described. By substantially the same technique as the lithographic technique of processing photomasks, a chromium thin film is formed on the surface of the large-size glass substrate using a sputtering system. A photosensitive material, typically resist material is coated thereon, exposed imagewise using an electron beam apparatus, and developed to form a resist pattern. The chromium thin-film is then etched while using the resist pattern as a mask, forming a chromium film pattern.

The photomask substrate thus obtained is rested horizontally on a substrate stage. The photomask substrate is generally supported on the upper or lower surface and at positions spaced several millimeters or several centimeters inside from the side edge. Specifically, the photomask substrate is held horizontally and secured at peripheral two or four sides on the upper surface by suction or vacuum chucking via alumina ceramic plates having a band width of 4 cm. In the case of fixed securing via ceramic plates, the ceramic plates are preferably rigid and constructed for tilting motion in a horizontal direction. Preferably the suction plates have a flatness of up to 5 μm. By virtue of the invention, a quantity of deformation of the substrate by clamping can be simulated using a computer-readable recording medium having the program previously recorded therein. The mechanism of tilting the suction plates is not always necessary. The influence of the accuracy of suction plates and a quantity of deformation by a stress caused by clamping of the substrate can also be simulated using the computer-readable recording medium having the program previously recorded therein. The influence of tilting angle can also be simulated.

The mother glass disposed beneath the photomask substrate and on the irradiation side may be a glass plate having a thickness of 0.5 to 1.2 mm with a thickness error within 100 μm. The stage used for chucking the mother glass should preferably be finished to a flatness within 20 μm, more preferably within 5 μm.

Thereafter, the proximity gap between the photomask substrate and the mother glass is measured over substantially the entire region by a laser displacement meter. The proximity gap thus measured has an average value of 50 to 100 μm and a gap error of 0 to 50 μm, preferably 0 to 10 μm, over the entire region excluding the peripheral regions extending 4 cm from the long sides.

The exposure method of the invention is applicable to other exposure systems including mirror projection and lens projection systems as long as exposure is made through the photomask substrate and the mother glass which are not kept in contact. Although the proximity gap is not involved, these systems normally carry out correction of a deflection of the photomask substrate by its own weight on the exposure apparatus side. Then, using the photomask substrate formed from the glass substrate according to the invention, the burden of correction on the exposure apparatus side is reduced or eliminated.

As discussed above, the present invention overcomes the outstanding problems of the prior art by calculating a deflection of every glass substrate by its own weight relative to its thickness, and processing the glass substrate stock to a shape that is inversely pre-deformed by that deflection. The thickness of glass substrate can be made thinner than in the prior art. For example, a glass substrate having a size of 830 by 960 mm and a thickness of 10 mm experiences a deflection by its own weight which is calculated in terms of material strength to be 89 μm under the four-side simple support condition. Similarly, a glass substrate having a size of 830 by 960 mm and a thickness of 8 mm experiences a deflection of 139 μm, and a glass substrate having a size of 830 by 960 mm and a thickness of 6 mm experiences a deflection of 247 μm. Once a glass substrate is processed to create a surface thereof on service (i.e., the lower surface during exposure) which is concave by the quantity of deflection in the vertical attitude, the glass substrate becomes fully flat in the horizontal attitude. Even a thin substrate can, in fact, provide a desired flatness during exposure. Since expensive quartz glass is often used as the TFT liquid crystal mask substrate at the present, the possibility of thinning the mask glass substrate leads to a reduction of substrate cost.

When the mother glass is exposed through a photomask substrate formed from the large-size glass substrate of the invention, the proximity gap is made smaller and uniform so that control of the proximity gap is facilitated. As a result, the number of products by exposure can be increased and the mother glass efficiently exposed. When projection exposure is carried out using a photomask substrate formed from the large-size glass substrate of the invention, the correction of a shifting of an optical axis by substrate deflection can be easily controlled.

EXAMPLE

Examples of the invention are given below by way of illustration and not by way of limitation. In Examples, flatness refers to (front) surface flatness unless otherwise stated. The flatness and parallelism of a substrate stock or substrate were measured using a flatness tester FTT-1500 by Kuroda Precision Industries Ltd. while holding the substrate stock or substrate vertically.

Example 1

A starting substrate or substrate stock was furnished by lapping a synthetic quartz glass substrate stock having a size of 330 mm×450 mm (diagonal length ca. 558 mm) and a thickness of 5.3 mm by means of a planetary motion double-side lapping machine using abrasives GC#600 (Fujimi Abrasive Co., Ltd.). The substrate stock had an accuracy as demonstrated by a front surface flatness of 22 μm (surface flatness/diagonal length=$39\times10^{-6}$), a back surface flatness of 25 μm, and a parallelism of 3 μm as measured in the vertical attitude and was of a shape having a higher center portion than the least square plane.

Then, a deflection of the substrate stock as lapped having a thickness of 5 mm by its own weight when held horizontally was calculated using material strength and the support position of a substrate when held horizontally. A substrate deformation and platen accuracy distortion were previously inspected from a quantity of deformation of a dummy glass substrate stock which was actually supported in place in the exposure apparatus and a variation of the proximity gap between this dummy glass substrate stock and a dummy mother glass resting on a platen, respectively. A quantity of material removal from a glass substrate stock to be processed was determined by taking into account the above-obtained deflection, deformation and distortion values. Consequently, a necessary sufficient removal quantity at each portion was determined by taking into account the above values, so that the front surface might be concave by 11 μm in the vertical attitude and the back surface is convex by 11 μm at the same time, and further taking into account irregularities on the front and back surfaces and thickness variations as measured in the vertical attitude and changes of flatness and parallelism when both the surfaces would be later polished away by about 50 μm in total by a double-side polishing machine. Removal operation was performed by means of a processing tool as shown below while controlling the feed rate of the tool in accordance with the removal quantity.

Specifically, the substrate stock was mounted on a platform 20 of the apparatus shown in FIG. 3. The apparatus included a processing tool having a pneumatic mechanism. The processing tool having a sandblasting nozzle 21 was movable in X and Y directions and substantially parallel to the platform 20. The tool was capable of blasting abrasive grits 22 (FO#800 by Fujimi Abrasive Co., Ltd.) under a pneumatic pressure of 0.1 MPa. The sandblasting nozzle had a rectangular ejection hole of 1 mm by 40 mm and was spaced from the surface of the substrate stock 1 by a distance of 40 mm.

Figure 4:
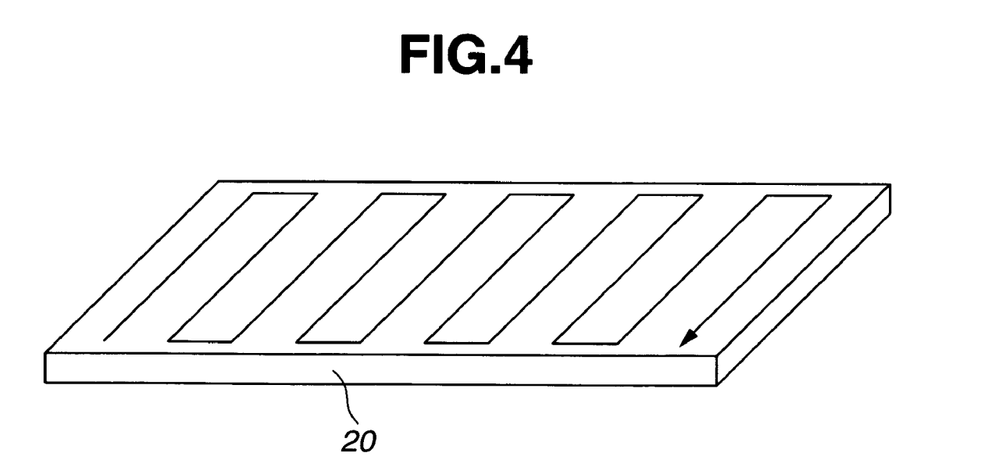
FIG. 4 is a perspective view showing the travel mode of a processing tool.

The processing technique involved moving the sandblasting nozzle continuously parallel to X axis, then moving a distance or pitch of 20 mm in Y axis direction, and so on as shown in FIG. 4. From the previously measured values, the processing rate under these conditions was computed to be 300 μm/min.

The feed rate of the sand-blasting nozzle was controlled in accordance with the necessary sufficient quantity to be removed which was determined by comprehensively taking into account (1) a flattening quantity of material to be removed determined on the basis of height data of the flatness of the front and back surfaces and the parallelism therebetween of the large-size glass substrate stock in the vertical attitude which are obtained by accurately measuring the flatness of the front and back surfaces of the large-size glass substrate stock in the vertical attitude (i.e., in the state where a deflection by its own weight in the horizontal attitude does not occur), (2) a quantity of material to be removed given by previously taking into account a deflection of the substrate stock by its own weight, calculated from the thickness and size of the substrate stock and the support position when the photomask substrate (formed from the substrate stock) is horizontally supported, (3) a quantity of material to be removed given by previously taking into account a deformation of the photomask substrate caused by the photomask substrate support when the photomask substrate is supported in the exposure apparatus, (4) a quantity of material to be removed given by previously taking into account an accuracy distortion of a platen for supporting the mother glass, and (5) a quantity of material to be removed determined by previously taking into account changes of flatness during subsequent both-side polishing or single-side polishing. The feed rate of the processing tool was 50 mm/sec at the portion of the substrate shape to which a smallest quantity of material removed was assigned on calculation. The above operation was performed on both the surfaces.

Thereafter, the substrate was polished by 50 μm by a double-side polishing tool, whereupon the surface flatness was measured to find that the surface had a flatness of 13 μm (flatness/diagonal length=$2.3 \times 10^{-5}$) and was of inverted dome shape. The parallelism was 2 μm. When a photomask substrate is horizontally held in an exposure apparatus by engagement for free motion at four sides, this corresponds to a flatness of 2 μm on calculation (flatness/diagonal length=$3.6 \times 10^{-6}$). This means that a substrate having a flatness of 2 μm (flatness/diagonal length=$3.6 \times 10^{-6}$) in the horizontal attitude is obtained. The flatness and parallelism of a substrate stock or substrate were measured using a flatness tester by Kuroda Precision Industries Ltd.

Next, the glass substrate was provided with a chromium film pattern by a process similar to a conventional lithographic photomask substrate manufacturing process. Specifically, a chromium thin-film was formed on the surface of the glass substrate using a sputtering system. A photosensitive composition, typically resist was coated thereon, exposed imagewise by means of an electron beam apparatus, and developed to form a pattern. Thereafter, the chromium thin-film was etched using the pattern as a mask, forming a patterned chromium film.

The photomask substrate was horizontally rested on a substrate stage. While the substrate was held horizontally, the substrate was secured at two peripheral sides on the upper surface by suction using porous ceramic plates having a band width of 4 cm. The ceramic plates were rigid and configured for free tilting in a horizontal direction. These suction plates had a flatness of 1 μm.

On the other hand, a stage for chucking a mother glass to be disposed beneath the photomask substrate for exposure was finished to a flatness of 5 μm or less. A glass plate having a size of 300×400 mm and a thickness of 0.7 mm with a thickness error within 2 μm was rested on the stage.

The proximity gap between the photomask substrate and the mother glass was measured over substantially the entire region using a laser displacement meter. The measurements of proximity gap included a maximum value of 53 μm and a minimum value of 47 μm, over the entire region excluding the peripheral regions extending 4 cm from the sides, with a gap error of 6 μm.

Example 2

The procedure of Example 1 was repeated except that a substrate stock having a size of 520 mm×800 mm (diagonal length ca. 954 mm) and a thickness of 10.4 mm was used.

The proximity gap was measured over substantially the entire region using a laser displacement meter. The measurements of proximity gap included a maximum value of 58 μm and a minimum value of 47 μm, over the entire region excluding the peripheral regions extending 4 cm from the sides, with a gap error of 11 μm.

Example 3

The procedure of Example 1 was repeated except that a substrate stock having a size of 850 mm×1,200 mm (diagonal length ca. 1,471 mm) and a thickness of 10.4 mm was used.

The proximity gap was measured over substantially the entire region using a laser displacement meter. The measurements of proximity gap included a maximum value of 59 μm and a minimum value of 47 μm, over the entire region excluding the peripheral regions extending 4 cm from the sides, with a gap error of 12 μm.

Example 4

The procedure of Example 1 was repeated except that a substrate stock having a size of 1,220 mm×1,400 mm (diagonal length ca. 1,857 mm) and a thickness of 13.4 mm was used.

The proximity gap was measured over substantially the entire region using a laser displacement meter. The measurements of proximity gap included a maximum value of 61 μm and a minimum value of 46 μm, over the entire region excluding the peripheral regions extending 4 cm from the sides, with a gap error of 15 μm.

Comparative Example 1

The procedure of Example 1 was repeated except that a substrate stock having a size of 850 mm×1,200 mm (diagonal length ca. 1,471 mm) and a thickness of 8.4 mm was used; and the necessary sufficient quantity to be removed on front and back surfaces and the area to be removed were determined by taking into account (1) a flattening quantity of material to be removed determined on the basis of height data of the flatness of the front and back surfaces and the parallelism therebetween of the large-size glass substrate stock in the vertical attitude which are obtained by accurately measuring the flatness of the front and back surfaces of the large-size glass substrate stock in the vertical attitude (i.e., in the state where a deflection by its own weight in the horizontal attitude does not occur), and (5) a quantity Q5 of material to be removed determined by previously taking into account changes of flatness during subsequent both-side polishing or single-side polishing, while disregarding (2) a quantity of material to be removed given by previously taking into account a deflection of the substrate stock by its own weight, (3) a quantity of material to be removed given by previously taking into account a deformation of the photomask substrate, and (4) a quantity of material to be removed given by previously taking into account an accuracy distortion of a platen for supporting the mother glass.

Thereafter, the substrate was polished by 50 μm by a double-side polishing tool. The surface flatness was measured to find that the surface had a flatness of 4 μm (flatness/diagonal length=$2.7 \times 10^{-6}$) and was concave. The parallelism was 2 μm.

When the deflection by its own weight is added to the measured flatness, the resultant flatness was about 130 μm (flatness/diagonal length=$8.8 \times 10^{-5}$), indicating a convex shape.

had a flatness of 4 μm (flatness/diagonal length=$2.2 \times 10^{-6}$) and was concave. The parallelism was 2 μm.

Next, as in Comparative Example 1, the glass substrate was processed into a photomask substrate, which was disposed in place in an exposure apparatus. The proximity gap was measured over substantially the entire region using a laser displacement meter. The measurements of proximity gap included a maximum value of 180 μm and a minimum value of 120 μm, over the entire region excluding the peripheral regions extending 4 cm from the sides, with a gap error of 60 μm.

It is noted that the proximity gap measured above had been corrected on the exposure apparatus side.

For Examples and Comparative Examples, the measured results of flatness and parallelism before and after processing are summarized in Table 1.

TABLE 1

| | | Substrate size (mm) thickness (mm) | Before processing Flatness, front/back (μm) | Parallelism (μm) | After processing | | | | | | |
|---|---|---|---|---|---|---|---|---|---|---|---|
| | | | | | Front surface flatness (μm) | | Horizontal attitude (calculated) Front surface flatness (μm) | | Proximity gap | | |
| | | | | | flatness (μm) | Parallelism (μm) | Flatness/ diagonal length | Parallelism (μm) | Maximum (μm) | Minimum (μm) | Error (μm) |
| Example | 1 | 330 × 450 × 5.3 | 22/25 | 3 | 13 | 2 | 2 $3.6 \times 10^{-6}$ | 2 | 53 | 47 | 6 |
| | 2 | 520 × 800 × 10.4 | 26/30 | 10 | 23 | 2 | 2 $2.1 \times 10^{-6}$ | 2 | 58 | 47 | 11 |
| | 3 | 850 × 1200 × 10.4 | 120/150 | 30 | 136 | 2 | 2 $1.4 \times 10^{-6}$ | 2 | 59 | 47 | 12 |
| | 4 | 1220 × 1400 × 13.4 | 210/220 | 40 | 243 | 2 | 2 $1.1 \times 10^{-6}$ | 2 | 61 | 46 | 15 |
| Comparative Example | 1 | 850 × 1200 × 8.4 | 100/112 | 30 | 4 | 2 | 130 $8.8 \times 10^{-6}$ | 2 | 280 | 120 | 160 |
| | 2 | 1220 × 1400 × 10.4 | 115/120 | 30 | 4 | 2 | 240 $1.3 \times 10^{-4}$ | 2 | 180 | 120 | 60 |

Next, as in Example 1, the glass substrate was processed into a photomask substrate, which was disposed in place in an exposure apparatus. The proximity gap was measured over substantially the entire region using a laser displacement meter. The measurements of proximity gap included a maximum value of 280 μm and a minimum value of 120 μm, over the entire region excluding the peripheral regions extending 4 cm from the sides, with a gap error of 160 μm.

It is noted that the proximity gap measured above had not been corrected on the exposure apparatus side.

Comparative Example 2

The procedure of Comparative Example 1 was repeated except that a substrate stock having a size of 1,220 mm×1,400 mm (diagonal length ca. 1,857 mm) and a thickness of 10.4 mm was used.

Thereafter, as in Comparative Example 1, the substrate was polished by 50 μm by a double-side polishing tool, whereupon the surface flatness was measured to find that the surface

The invention claimed is:

1. A method for preparing a large-size glass substrate, from which a photomask substrate is formed, the photomask substrate being used in a mother glass exposure process including attaching a photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate, said method comprising the step of processing a large size glass substrate stock having front and back surfaces and a diagonal length of at least 500 mm into the large-size glass substrate, by removing therefrom (1) a flattening removal quantity of material based on a height data of the flatness and parallelism of the front and back surfaces of the large-size glass substrate stock in the vertical attitude, plus a deformation-corrective removal quantity of material, the deformation-corrective removal quantity being calculated from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass, wherein the resulting large-size glass substrate has such an arcuate shape in cross section that the surface to be opposed to the mother glass is concave when held vertically, and reduces the proximity gap variation between the mother glass and the photomask substrate formed from the large-size glass substrate which is held horizontally when the opposed side edges of the photomask substrate are supported in the exposure apparatus.

2. The method of claim 1, wherein the method further comprises, after the processing for flattening and deformation-correction step, the post step of polishing the glass substrate on one or both of its surfaces, the deformation-corrective removal quantity being calculated by further adding (5) a change of flatness by the post step of polishing.

3. The method of claim 1 or 2 wherein the removing step uses a processing tool of sand blasting.

4. The method of claim 3 wherein the removing step using a processing tool of sand blasting is performed at a constant pressure.

5. The method of claim 3 wherein the sand blasting uses particles of cerium oxide, silicon oxide, aluminum oxide or silicon carbide.

6. The method of claim 1 wherein the surface of the substrate stock at an arbitrary position is processed while the substrate stock and/or the processing tool is moved.

7. A large-size glass substrate, from which a photomask substrate is formed, wherein the photomask substrate is used in a mother glass exposure process including attaching a photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate, said large-size glass substrate is produced by processing a large-size glass substrate stock having front and back surfaces and a diagonal length of at least 500 mm and a thickness of at least 4 mm, by (1) a flattening removal quantity of material based on a height data of the flatness and parallelism of the front and back surfaces of the large-size glass substrate stock in the vertical attitude, plus a deformation-corrective removal quantity of material, the deformation-corrective removal quantity is calculated from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass, the large-size glass substrate has such an arcuate shape in cross section that the surface to be opposed to the mother glass is concave when held vertically, and reduces the proximity gap variation between the mother glass and the photomask substrate formed from the large-size glass substrate which is held horizontally when the opposed side edges of the photomask substrate are supported in the exposure apparatus.

8. The large-size glass substrate of claim 7 which has a surface flatness/diagonal length of up to 4.8'10-5 in the horizontal attitude.

9. The large-size glass substrate of claim 7 or 8 which has a diagonal length of up to 825 mm and a thickness from 3 mm to less than 6 mm.

10. The large-size glass substrate of claim 7 or 8 which has a diagonal length of 800 to 1650 mm and a thickness of 6 to 11 mm.

11. The large-size glass substrate of claim 7 or 8 which has a diagonal length of 1800 to 2150 mm and a thickness of 9 to 16 mm.

12. The large-size glass substrate of claim 7 or 8 which has a diagonal length of 2151 to 3000 mm and a thickness of 9 to 20 mm.

13. A mother glass exposure process comprising attaching a photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate, wherein said photomask substrate is formed from a large-size glass substrate which is prepared by processing a large-size glass substrate stock having front and back surfaces and a diagonal length of at least 500 mm and a thickness of at least 4 mm, by (1) a flattening removal quantity of material based on a height data of the flatness and parallelism of the front and back surfaces of the large-size glass substrate stock in the vertical attitude, plus a deformation-corrective removal quantity of material, the deformation-corrective removal quantity is calculated from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass, the large-size glass substrate has such an arcuate shape in cross section that the surface to be opposed to the mother glass is concave, when held vertically, the photomask substrate is held horizontally when the opposed side edges of the photomask substrate are supported in the exposure apparatus, whereby the proximity gap variation between the mother glass and the photomask substrate is reduced.

14. The mother glass exposure process of claim 13 wherein the large-size glass substrate has a surface flatness/diagonal length of up to $4.8 \times 10^{-5}$ in the horizontal attitude.

15. A computer-readable recording medium for recording a method for preparing a large-size glass substrate from a large-size glass substrate stock having front and back surfaces and a diagonal length of at least 500 mm and a thickness of at least 4 mm,

- a photomask substrate being formed from said large size glass substrate, the photomask substrate being used in a mother glass exposure process including attaching the photomask substrate having opposed sides to an exposure apparatus through support of opposed side edges, disposing underneath and adjacent to the photomask substrate a mother glass serving as an array side or color filter side substrate in a TFT liquid crystal panel, and irradiating light from the exposure apparatus to the mother glass through the photomask substrate, said medium having recorded therein a program for operating the computer to execute the following steps:

- a step of calculating (1) a flattening removal quantity of material based on a height data of the flatness and parallelism of the front and back surfaces of a large-size glass substrate stock having a diagonal length of at least 500 mm and a thickness of at least 4 mm in the vertical attitude,
- a step of calculating a deformation-corrective removal quantity of material from (2) a deflection of the substrate stock by its own weight in the horizontal attitude, calculated from the thickness and size of the substrate stock, and the support position when the photomask substrate is horizontally supported, (3) a deformation of the photomask substrate caused by the photomask substrate support when the photomask substrate is attached to the exposure apparatus, and (4) an accuracy distortion of a platen for supporting the mother glass, and
- a step of delivering a command to a processing machine to carry out processing for flattening and deformation-correction by removing a total quantity of material derived from the flattening removal quantity and the deformation-corrective removal quantity.

16. The recording medium of claim 15 wherein the method further comprises, after the processing for flattening and deformation-correction step, the post step of polishing the glass substrate on one or both of its surfaces, the program further includes a step of calculating the total quantity of material by further adding (5) a change of flatness by the post step of polishing.

\* \* \* \* \*